(12) United States Patent
Phatto et al.

(10) Patent No.: US 12,736,425 B2
(45) Date of Patent: Sep. 15, 2026

(54) SEMICONDUCTOR DEVICE AND METHOD FOR SENSING EXTERNAL CONDITION IN HARSH ENVIRONMENT

(71) Applicant: UTAC Headquarters Pte. Ltd., Singapore (SG)

(72) Inventors: Paweena Phatto, Bangkok (TH); Maythichai Saithong, Bangkok (TH); Eakkasit Dumsong, Bangkok (TH); Jiraphat Charoenratpratoom, Bangkok (TH)

(73) Assignee: UTAC Headquarters Pte. Ltd., Singapore (SG)

( * ) Notice: Subject to any disclaimer, the term of this patent is extended or adjusted under 35 U.S.C. 154(b) by 513 days.

(21) Appl. No.: 18/334,402

(22) Filed: Jun. 14, 2023

(65) Prior Publication Data

US 2024/0003768 A1 Jan. 4, 2024

Related U.S. Application Data

(60) Provisional application No. 63/367,328, filed on Jun. 30, 2022.

(51) Int. Cl.
*G01L 9/00* (2006.01)
*H10W 72/00* (2026.01)
(Continued)

(52) U.S. Cl.
CPC .......... *G01L 9/0045* (2013.01); *H10W 90/00* (2026.01); *H10W 72/5449* (2026.01);
(Continued)

(58) Field of Classification Search
CPC ... G01L 9/0045; H01L 25/0657; H01L 25/50; H01L 24/32; H01L 24/48; H01L 24/73; H01L 2224/32145; H01L 2224/32225; H01L 2224/48108; H01L 2224/48145; H01L 2224/48227; H01L 2224/73215; H01L 2224/73265; H01L 2225/06506;
(Continued)

(56) References Cited

U.S. PATENT DOCUMENTS 6,844,632 B2 1/2005 Shiono et al.
10,892,229 B2 1/2021 Hooper et al.
(Continued)

*Primary Examiner* — Timor Karimy
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate and a first electrical component including a sensing region disposed over the substrate. The sensing region can be responsive to external stimuli, such as pressure. A cover lid is disposed over the first electrical component and extending to the substrate with an opening in the cover lid aligned over the sensing region. A gel material is disposed within the opening of the cover lid to seal the sensing region with respect to an environment condition, such as liquid. A bond wire is coupled between the first electrical component and substrate. An adhesive layer is disposed around a perimeter of the sensing area and the cover lid is bonded to the adhesive layer. A second electrical component is disposed on the substrate and the first electrical component is disposed on the second electrical component.

18 Claims, 16 Drawing Sheets

(51) Int. Cl.
*H10W 72/50* (2026.01)
*H10W 76/67* (2026.01)
*H10W 90/00* (2026.01)
*H10W 90/20* (2026.01)

(52) U.S. Cl.
CPC ........ *H10W 72/865* (2026.01); *H10W 72/884* (2026.01); *H10W 76/67* (2026.01); *H10W 90/20* (2026.01); *H10W 90/732* (2026.01); *H10W 90/734* (2026.01); *H10W 90/752* (2026.01); *H10W 90/754* (2026.01)

(58) Field of Classification Search
CPC ... H01L 2225/0651; H01L 2225/06524; H01L 2924/16151; H01L 2924/1659; H10B 80/00; H10W 90/00; H10W 90/732; H10W 90/20; H10W 90/754; H10W 90/734; H10W 90/752; H10W 76/67; H10W 72/884; H10W 72/865; H10W 72/5449
See application file for complete search history.

(56) References Cited

U.S. PATENT DOCUMENTS

2013/0126988 A1* 5/2013 Lo .......................... H01L 24/97
438/51
2019/0148566 A1* 5/2019 Kalz ...................... H10F 77/30
257/414

* cited by examiner

SEMICONDUCTOR DEVICE AND METHOD FOR SENSING EXTERNAL CONDITION IN HARSH ENVIRONMENT

CLAIM OF DOMESTIC PRIORITY

The present application claims the benefit of U.S. Provisional Application No. 63/367,328, filed Jun. 30, 2022, which application is incorporated herein by reference.

FIELD OF THE INVENTION

The present invention relates in general to semiconductor devices and, more particularly, to a semiconductor device and method of sensing an external condition in a harsh environment.

BACKGROUND OF THE INVENTION

Semiconductor devices are commonly found in modern electronic products. Semiconductor devices perform a wide range of functions, such as signal processing, high-speed calculations, sensors, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

One type of semiconductor device is a pressure sensor for sensing external pressure. The pressure sensor can be designed to operate in a liquid environment, such as water. FIG. 1 shows a conventional pressure sensor 50 with ceramic substrate 52 having major surface 54 and major surface 56 opposite surface 54. Contacts 60 and 62 are formed on surfaces 56 and 54, respectively. Semiconductor die 70 is disposed on substrate 52 with adhesive 68 and electrical contact 72 connected to contact 62 by bond wire 74. Semiconductor die 70 further has sensing area 76 formed in surface 78. Sensing area 76 has a transducer that is responsive to external pressure by bending or deforming and generating an electrical signal proportional to the applied external pressure. A vessel 80 is disposed around semiconductor die 70. Vessel 80 has perimeter walls but no top portion. A gel material 88 is deposited around semiconductor die 70 to seal off sensing area 78 from the external environment, such as water. Pressure sensor 50 uses a considerable amount of gel material, which increases manufacturing cost and potential defects.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Figure 2A:
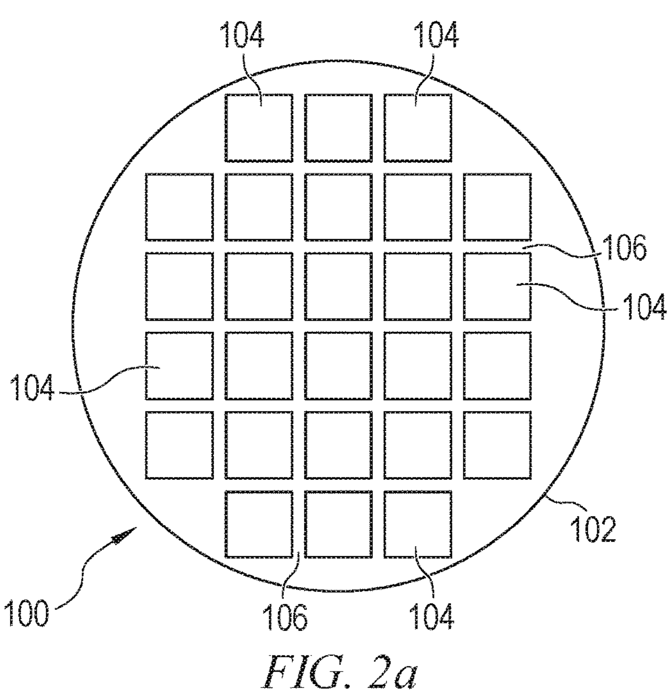
FIGS. 2*a*-2*c* illustrate a semiconductor wafer with a plurality of semiconductor die separated by a saw street.

FIG. 2*a* shows semiconductor wafer or substrate 100 with a base substrate material 102, such as silicon (Si), silicon carbide (SiC), cubic silicon carbide (3C-SiC), germanium, aluminum phosphide, aluminum arsenide, gallium arsenide, gallium nitride, indium phosphide, diamond, and all families of III-V and II-VI semiconductor materials for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 2B:
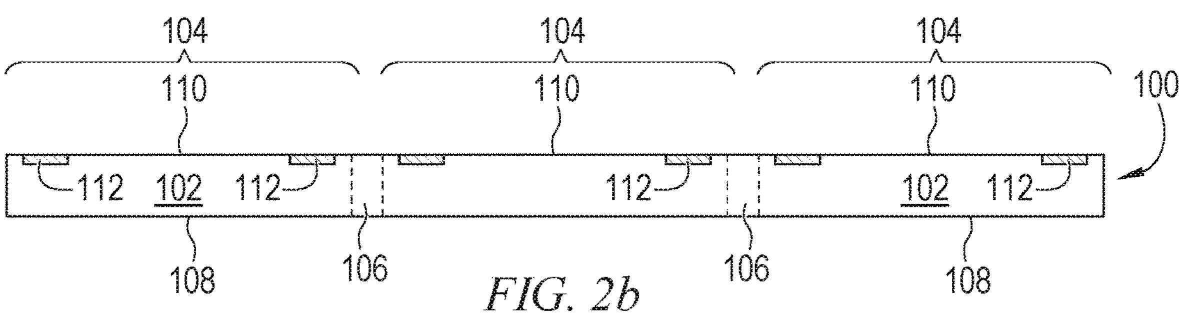

FIG. 2*b* shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other active signal processing circuit. Semiconductor die 104 may also contain IPDs, such as diodes, inductors, capacitors, resistors, and other passive components.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Figure 2C:
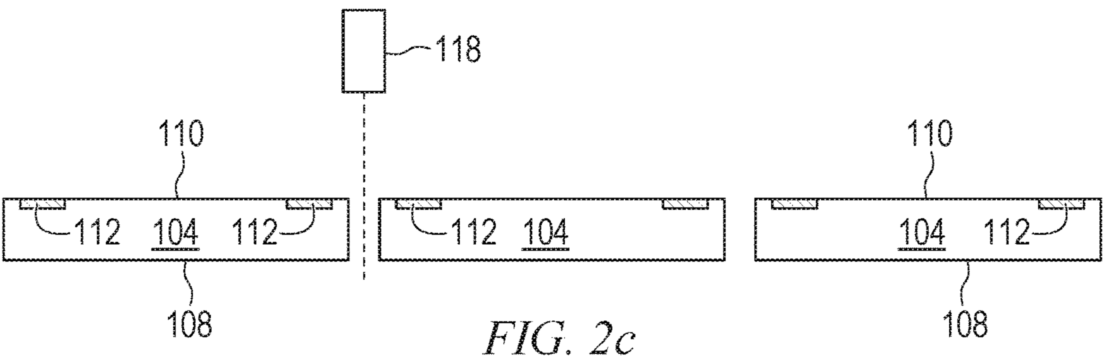

In FIG. 2*c*, semiconductor wafer 100 is singulated through saw street 106 using a saw blade or laser cutting tool 118 into individual semiconductor die 104. The individual semiconductor die 104 can be inspected and electrically tested for identification of known good die (KGD) post singulation.

Figure 3A:
FIGS. 3*a*-3*o* illustrate a cover lid with an opening centered over a sensing region of an electrical component and sealed with a gel material.
Figure 3B:
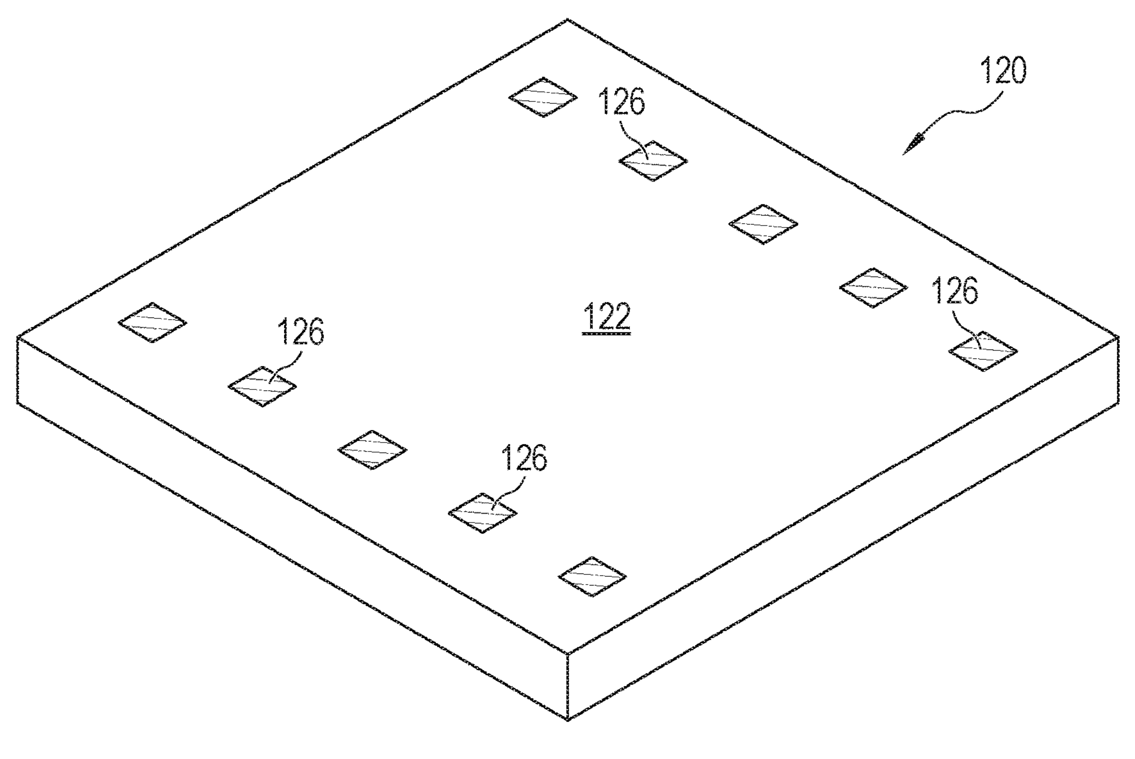
Figure 3C:
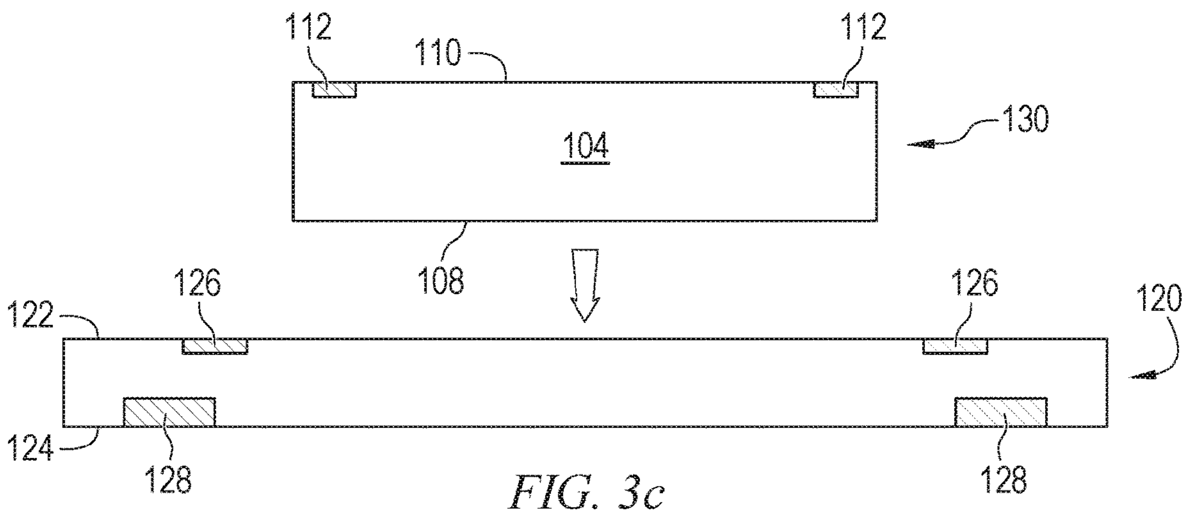
Figure 3D:
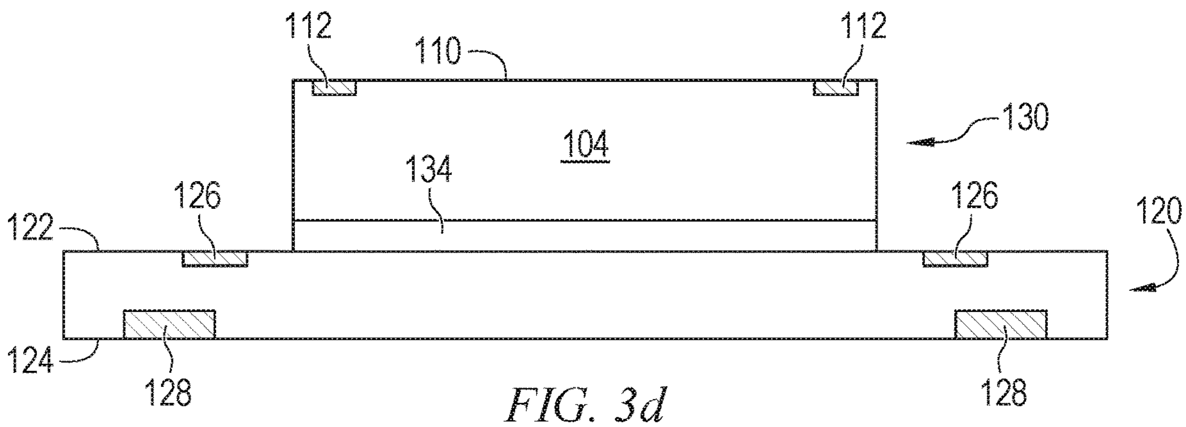
Figure 3E:
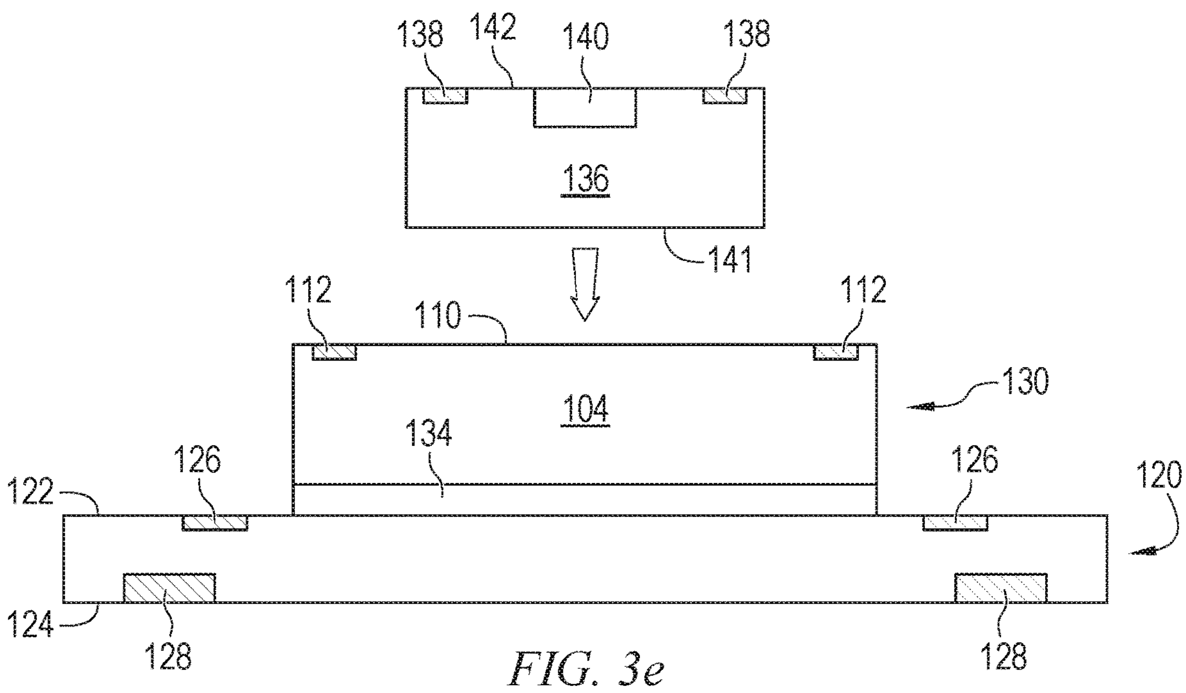
Figure 3F:
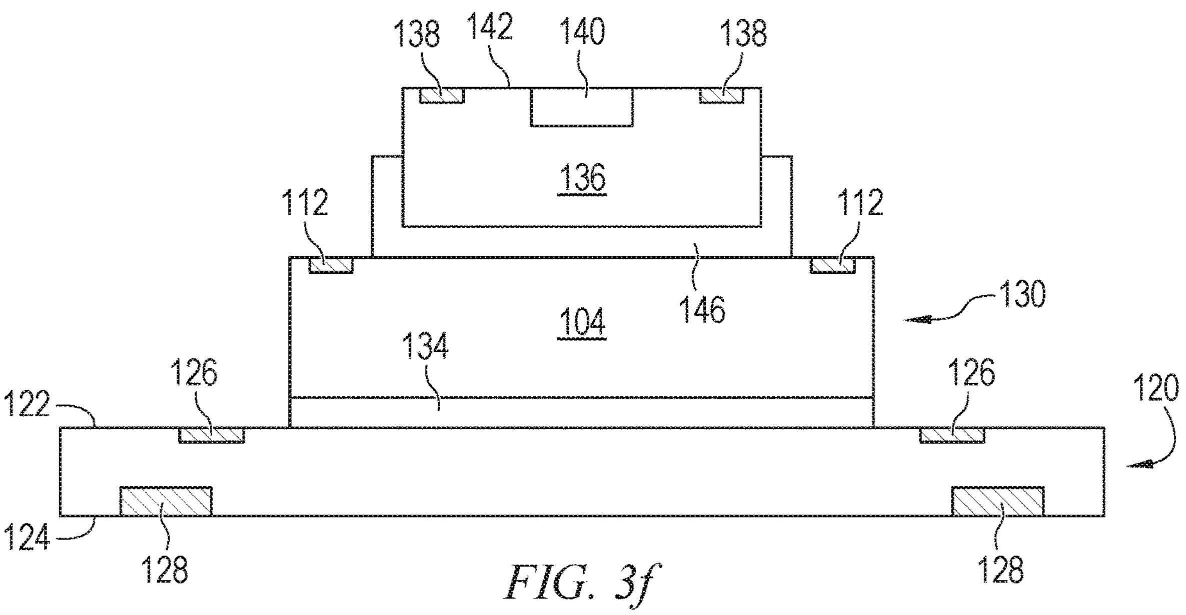
Figure 3G:
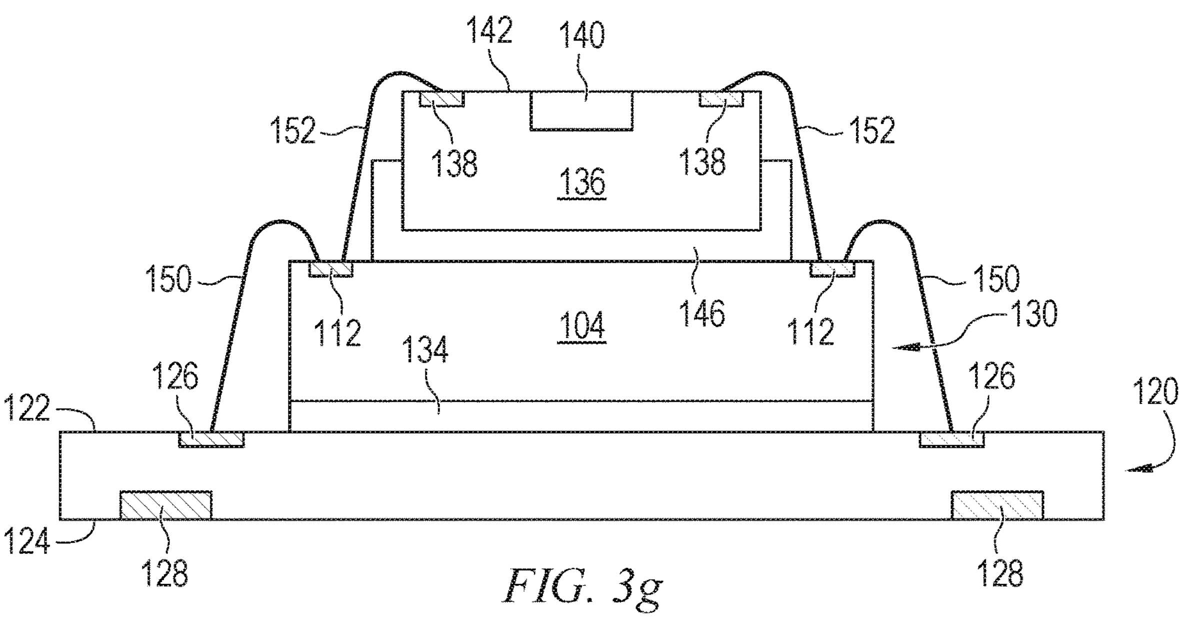
Figure 3H:
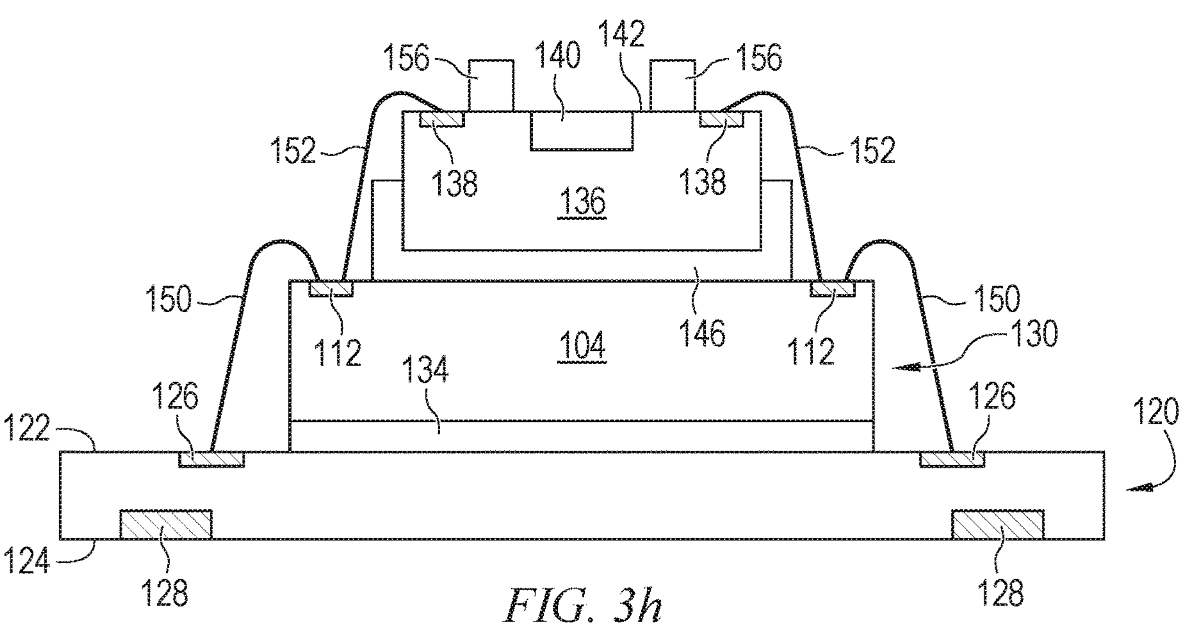
Figure 3I:
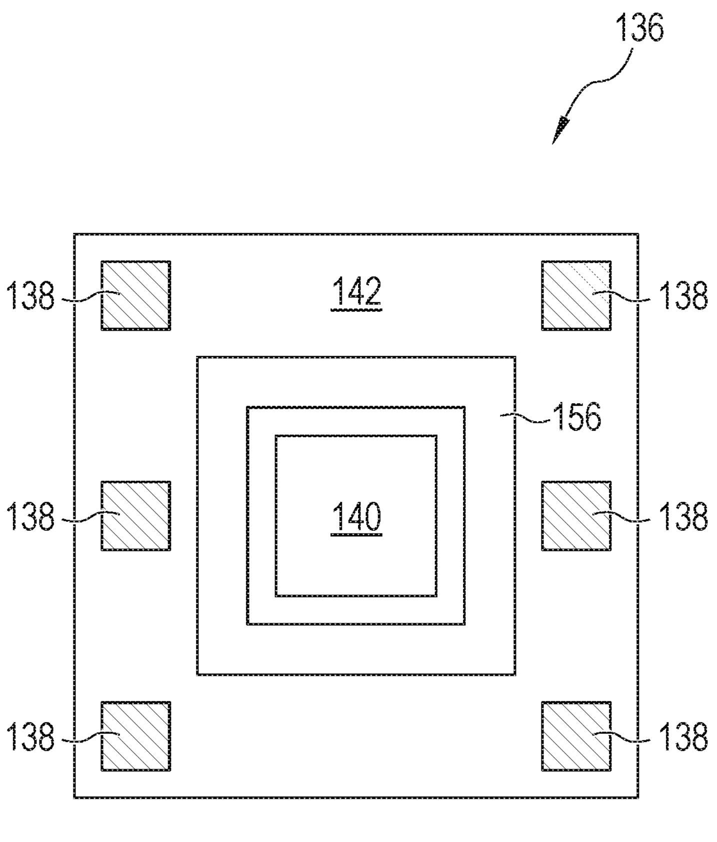
Figure 3J:
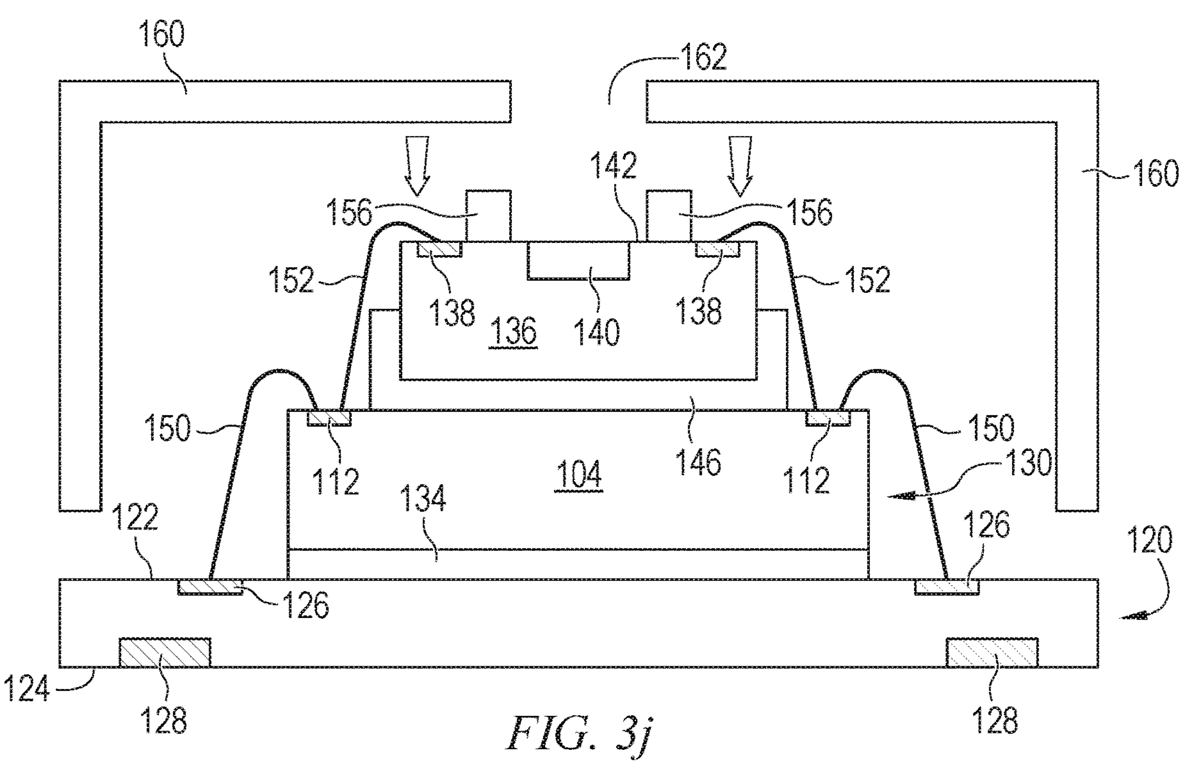
Figure 3K:
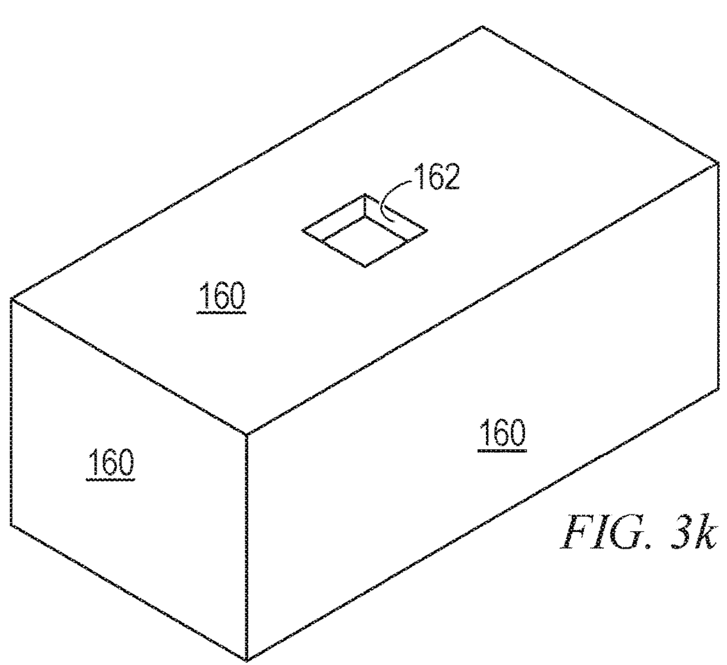
Figure 3L:
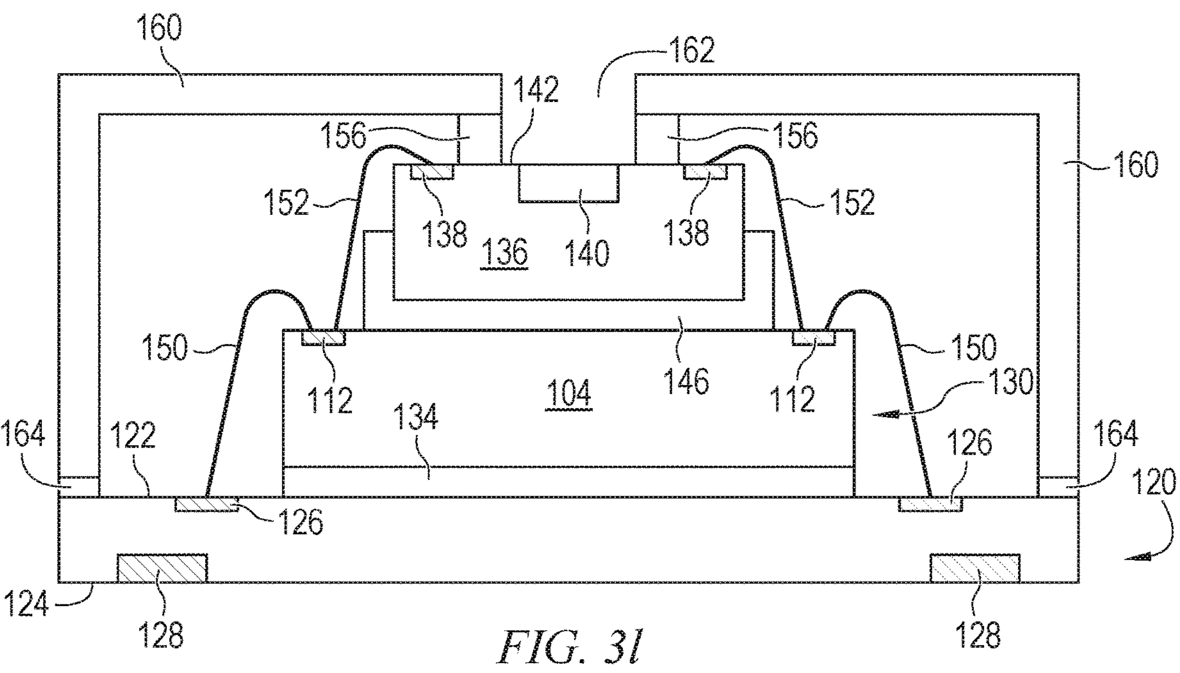
Figure 3M:
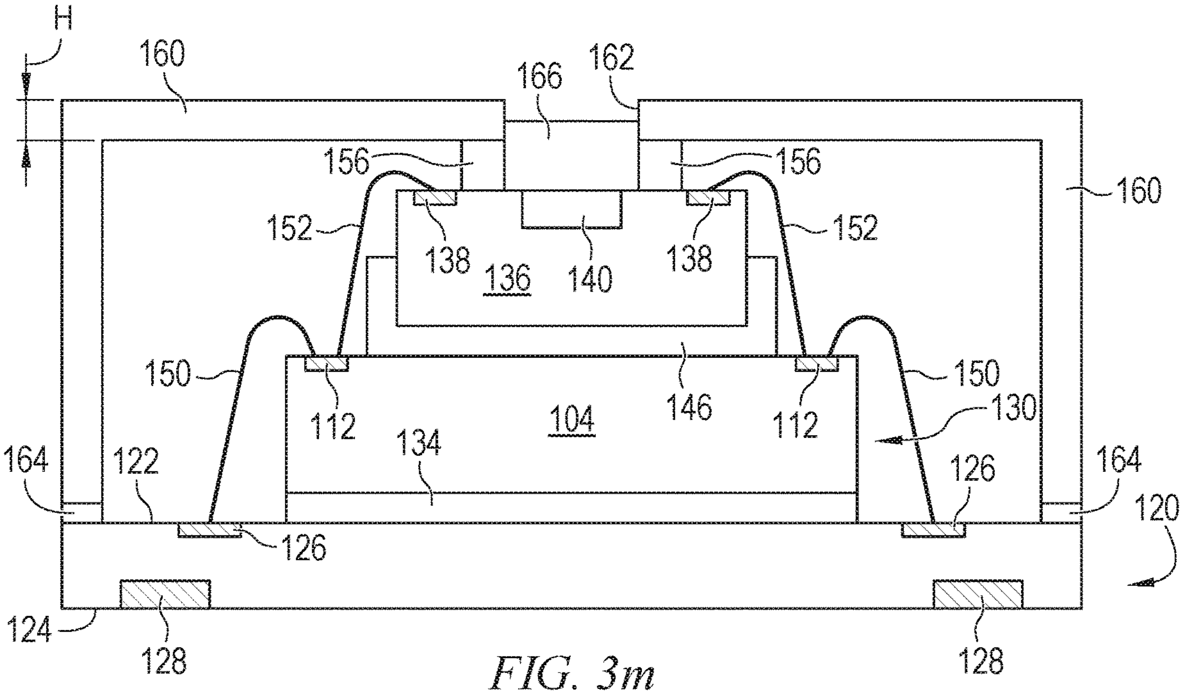
Figure 3N:
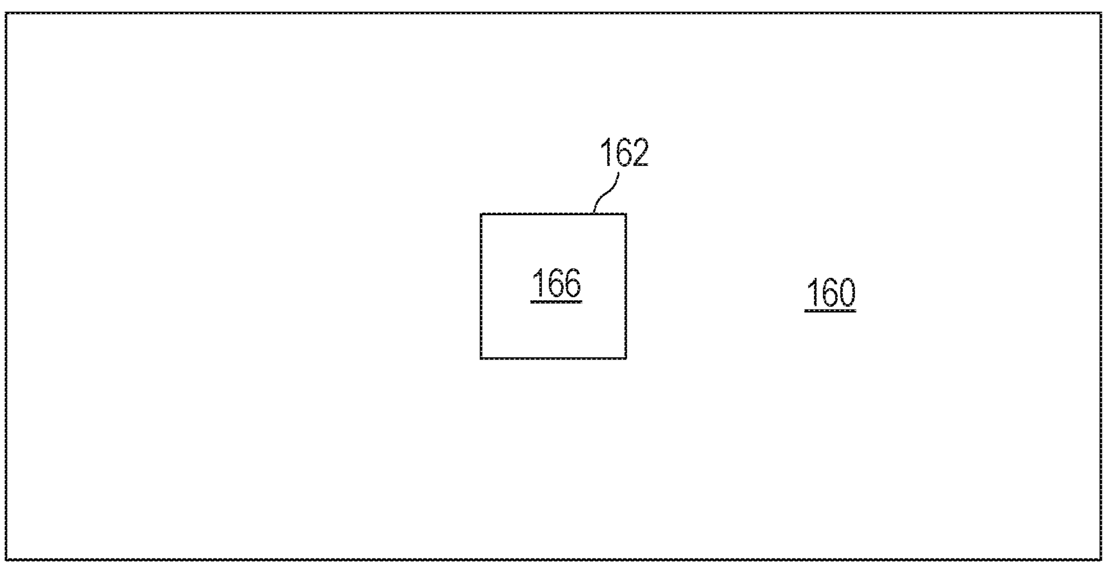
Figure 3O:
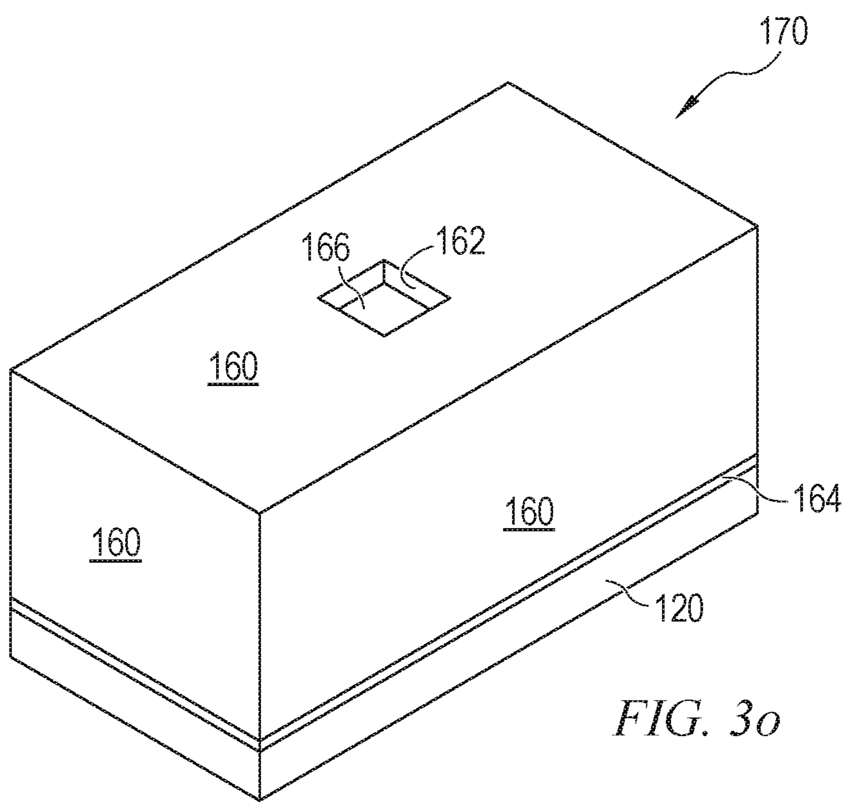

FIGS. 3*a*-3*o* illustrate a process of forming a semiconductor package with a cover lid disposed over a substrate and electrical component, and gel material deposited within an opening of the cover lid to environmentally seal a sensing region of the electrical component and other areas inside the cover lid. FIG. 3*a* shows a cross-sectional view of substrate 120 made with a multi-layer ceramic, polymer, metal, or other rigid material. For example, the ceramic substrate 120 is formed by multiple ceramic tape layers which are processed with metallization to create the package substrate or package body. Substrate 120 has major surface 122 and major surface 124, opposite surface 122.

An electrically conductive layer 126 is formed over surface 122 of substrate 120 using PVD, CVD, electrolytic plating, electroless plating process, or other suitable metal deposition process. In a similar manner, conductive layer 128 is formed over surface 124 of substrate 120. Conductive layers 126 and 128 can be one or more layers of Al, Cu, Sn, Ni, Au, Ag, tungsten (W), molybdenum (Mo), or other suitable electrically conductive material and alloys thereof. Other types of metallization may also be useful. Conductive layers 126 and 128 operate as contact pads electrically connected to the circuits or conductive layers on or within substrate 120. FIG. 3*b* is a perspective view of substrate 120 with conductive layers 126 and 128. Other types of package substrates or techniques for forming the metallization may also be useful.

In FIG. 3*c*, electrical component 130 is disposed over surface 122 of substrate 120. For example, electrical component 130 can be similar to, or made similar to, semiconductor die 104 from FIG. 2*c* with conductive layer 112 oriented away from surface 122 of substrate 120. Electrical component 130 can include semiconductor packages, surface mount devices, RF components, discrete electrical devices, or integrated passive devices (IPD). In one embodiment, electrical component 130 is an ASIC.

Electrical component 130 is positioned over substrate 120 using a pick and place operation. Back surface 108 of electrical component 130 is brought up to surface 122 and bonded in place with adhesive 134. FIG. 3*d* illustrates electrical component 130 bonded to surface 122 of substrate 120 with adhesive 134.

In FIG. 3*e*, electrical component 136 is disposed over active surface 110 of electrical component 130. For example, electrical component 136 can be similar to, or made similar to, semiconductor die 104 from FIG. 2*c*. Electrical component 130 can include semiconductor packages, surface mount devices, RF components, discrete electrical devices, or IPD. In one embodiment, electrical component 136 includes a micro-electrical mechanical system (MEMS).

An electrically conductive layer 138 is formed over surface 142 of electrical component 136 using PVD, CVD, electrolytic plating, electroless plating process, or other suitable metal deposition process. Conductive layer 138 can be one or more layers of Al, Cu, Sn, Ni, Au, Ag, or other suitable electrically conductive material. Conductive layer 138 operate as a contact pad electrically connected to the circuits or conductive layers on or within electrical component 136.

Electrical component 136 further includes sensing or sensor region 140 formed on surface 142 between portions of conductive layer 138. Sensing region 140 is a transducer for converting an attribute of an environmental condition to an electrical signal. The environmental condition can be pressure, temperature, sound, chemical, moisture, or other stimuli from the environmental space. The environmental space can be liquid, gaseous, vacuum, or other harsh physical space or environment. In one embodiment, sensing region 140 senses pressure in a liquid or water environment. Sensing region 140 may bend or deform in response to the pressure or other external stimuli. The bending or deforming of sensing region 140 generates the electrical signal proportional to the external stimuli.

Electrical component 136 is positioned over electrical component 130 using a pick and place operation. Back surface 141 of electrical component 136 is brought up to active surface 110 and bonded in place with adhesive 146. FIG. 3*f* shows electrical component 136 bonded to surface 110 of electrical component 130 with adhesive 146.

In FIG. 3*g*, bond wires 150 are coupled between conductive layer 112 on electrical component 130 and conductive layer 126 on substrate 120. Bond wires 152 are coupled between conductive layer 138 on electrical component 136 and conductive layer 112 on electrical component 130. Accordingly, electrical component 136 is in electrical communication with electrical component 130 and further in electrical communication with substrate 120. Electrical component 130 is in electrical communication with substrate 120.

In FIG. 3*h*, adhesive or sealant layer 156 is deposited on surface 142 of electrical component 136 around a perimeter of sensing region 140. FIG. 3*i* shows a top view of adhesive layer 156 covering an area on surface 142 of electrical component 136 around a perimeter of sensing region 140.

In FIG. 3*j*, cover lid 160 is disposed over substrate 120 and electrical components 130 and 136 with opening or window 162 centered or aligned over sensing region 140. Cover lid 160 can be made with ceramic, polymer, metal, or other rigid material. FIG. 3*k* is a perspective view of cover lid 160 with opening 162. Cover lid 160 is brought into contact with adhesive layer 156. Cover lid 160 is also brought up to substrate 120. FIG. 3*l* shows cover lid 160 bonded to substrate 120 with adhesive 164 and further bonded to electrical component 136 with adhesive layer 156, and opening 162 exposing sensing region 140. Cover lid 160 seals off electrical components 130 and 136 by nature of adhesive layers 156 and 164, with opening 162 exposing sensing region 140.

In FIG. 3*m*, gel material 166 is deposited within opening 162 over sensing region 140. Gel material 166 can be a malleable material, such as silicone, to transfer external stimuli, such as pressure, through the gel material to sensing region 140. In one embodiment, gel material 166 comes to at least the bottom surface of cover lid 160 and preferably about halfway up, or less than half, a height H of the cover lid. Gel material 166 may extend to a top surface of cover lid 160, or below the bottom surface of cover lid 160. FIG. 3*n* is a top view of gel material 166 deposited within opening 162.

Figure 1:
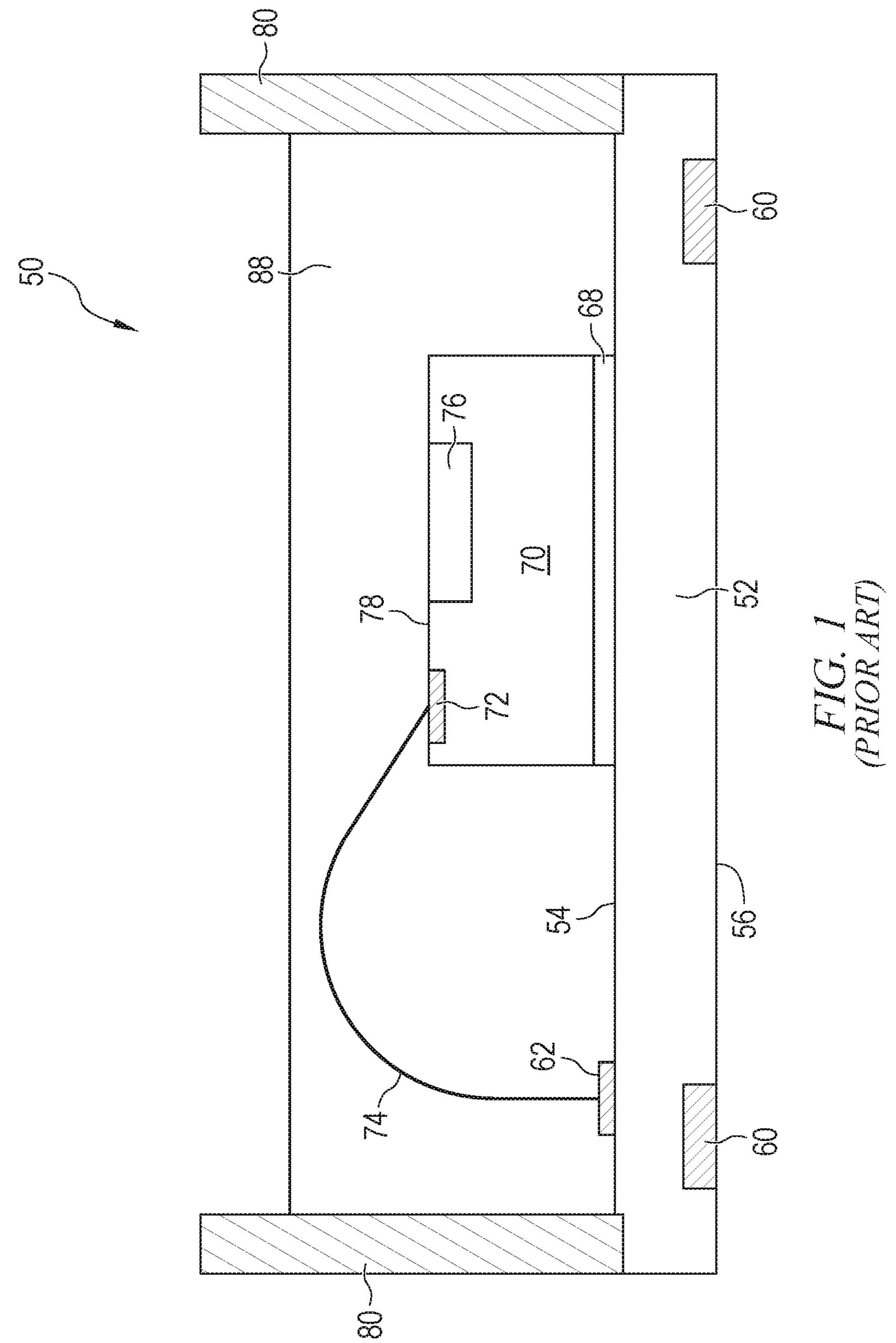
FIG. 1 illustrates a conventional pressure sensor embedded within gel material in a vessel.

FIG. 3*o* is a perspective view of semiconductor package 170 with cover lid 160 disposed over substrate 120 and electrical components 130 and 136. Gel material 166 is deposited within opening 162 to environmentally seal sensing region 140 and other areas inside cover lid 160, e.g., electrical components 130 and 136 and bond wires 150 and 152. In one embodiment, cover lid 160 with gel material 166 provides a waterproof seal for pressure sensor semiconductor package 170. Semiconductor package 170 with cover lid 160 and opening 162 uses substantially less gel material, as compared to the prior art in FIG. 1, to reduce manufacturing costs and defects.

Figure 4:
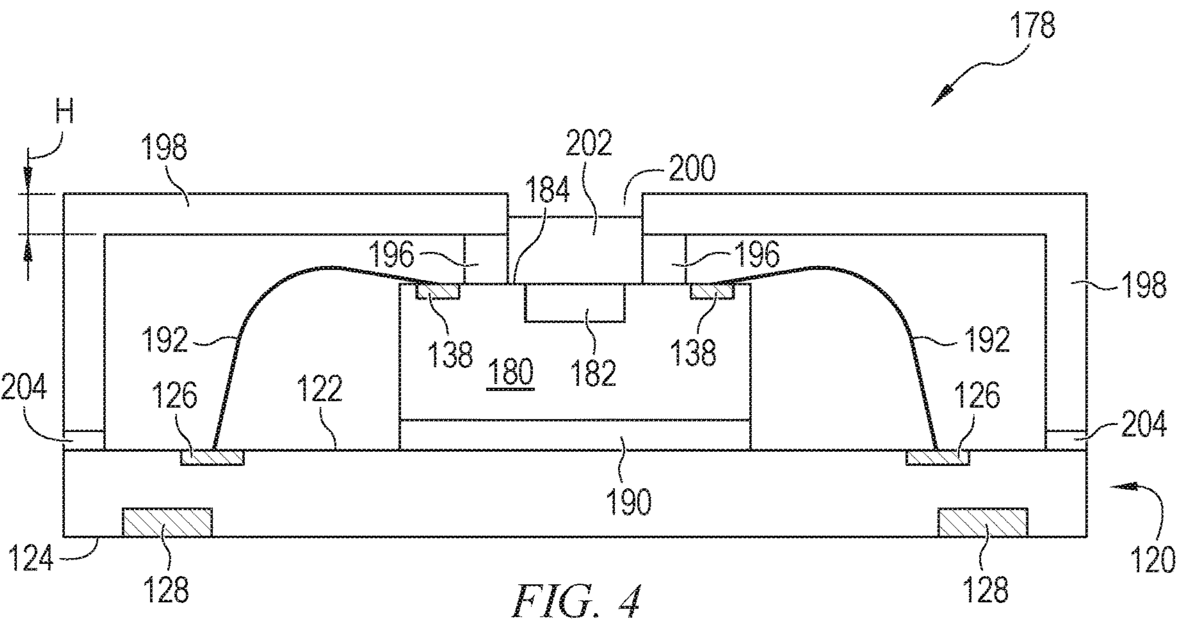
FIG. 4 illustrates another embodiment of a cover lid with an opening centered over a sensing region of an electrical component and sealed with a gel material.

FIG. 4 illustrates another embodiment of pressure sensor semiconductor package 178, made similar to FIGS. 3*a*-3*o*. Elements having similar features are assigned the same reference number. Electrical component 180 can be similar to, or made similar to, semiconductor die 104 from FIG. 2*c* with conductive layer 138 oriented away from surface 122 of substrate 120. Electrical component 180 can include semiconductor packages, surface mount devices, RF components, discrete electrical devices, or IPD. In one embodiment, electrical component 180 is an ASIC with MEMS features. That is, electrical component 180 further includes sensing or sensor region 182 formed on surface 184 between portions of conductive layer 138. Sensing region 182 is a transducer for converting an attribute of an environmental condition to an electrical signal. The environmental condition can be pressure, temperature, sound, chemical, moisture, or other stimuli from the environmental space. The environmental space can be liquid, gaseous, vacuum, chemical, or other harsh physical space or environment. In one embodiment, sensing region 182 senses pressure in a liquid or water environment. Sensing region 182 may bend or deform in response to the pressure or other external stimuli. The bending or deforming of sensing region 182 generates the electrical signal proportional to the external stimuli.

The back surface of electrical component 180 is brought up to surface 122 and bonded in place with adhesive 190. Bond wires 192 are coupled between conductive layer 138 on electrical component 180 and conductive layer 126 on substrate 120. Electrical component 180 is in electrical communication with substrate 120. An adhesive or sealant layer 196 is deposited on surface 110 of electrical component 180 around a perimeter of sensing region 182, similar to FIGS. 3*h*-3*i*. Cover lid 198 is bonded to substrate 120 with adhesive layer 204 and further bonded to electrical component 180 with adhesive layer 196. Cover lid 198 with opening or window 200 is centered or aligned over sensing region 182. Cover lid 198 can be made similar to cover lid 160. Cover lid 198 seals off electrical component 180 by nature of adhesive layers 196 and 204, with opening 200 exposing sensing region 182. Gel material 202 is deposited within opening 200 over sensing region 182. Gel material 202 can be a malleable material, such as silicone, to transfer external stimuli, such as pressure, to sensing region 182. Gel material 202 typically comes to at least the bottom surface of cover lid 198 and preferably about halfway up, or less than half, a height H of the cover lid. Gel material 202 may extend to a top surface of cover lid 198, or below a bottom surface of cover lid 198.

Semiconductor package 178 includes cover lid 198 disposed over substrate 120 and electrical component 180 and gel material 202 deposited within opening 200 environmental seals sensing region 182 and other areas inside cover lid 198, e.g., electrical component 180 and bond wires 192. In one embodiment, cover lid 198 with gel material 202 provides a waterproof seal for pressure sensor semiconductor package 178. Semiconductor package 178 with cover lid 198 and opening 182 uses substantially less gel material, as compared to the prior art in FIG. 1, to reduce manufacturing costs and defects.

Figure 5A:
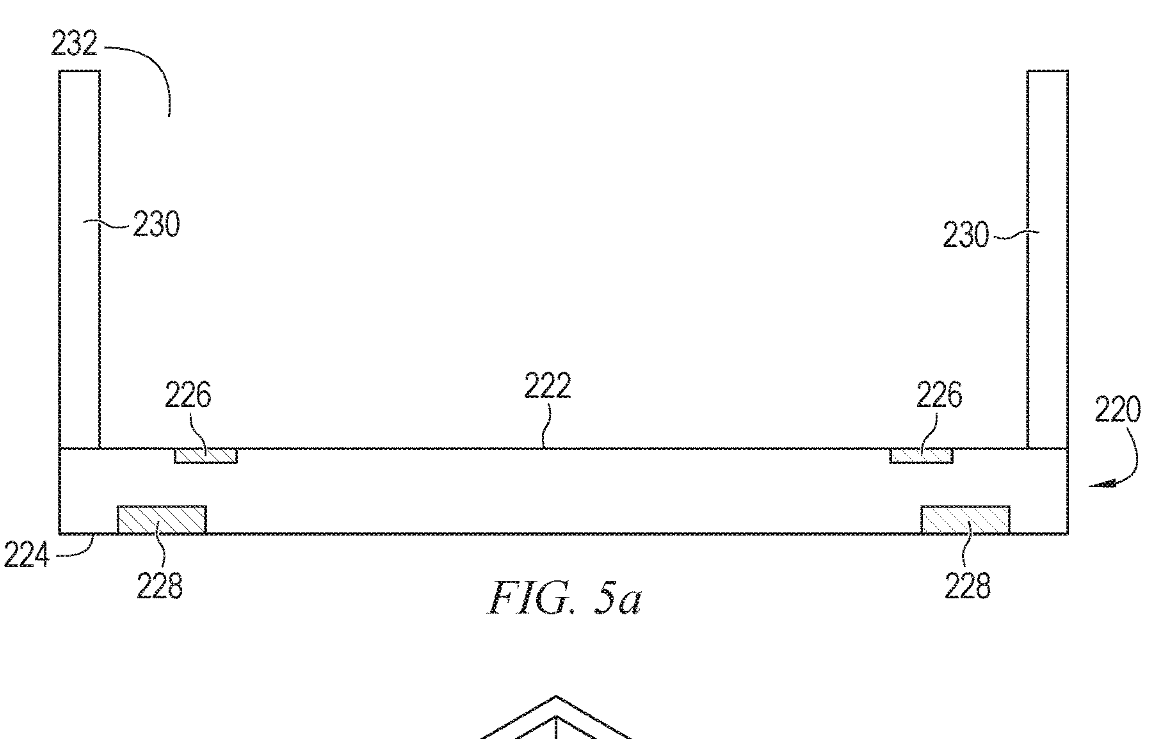
FIGS. 5*a*-5*i* illustrate another embodiment of a cover lid with an opening centered over a sensing region of an electrical component and sealed with a gel material.
Figure 5B:
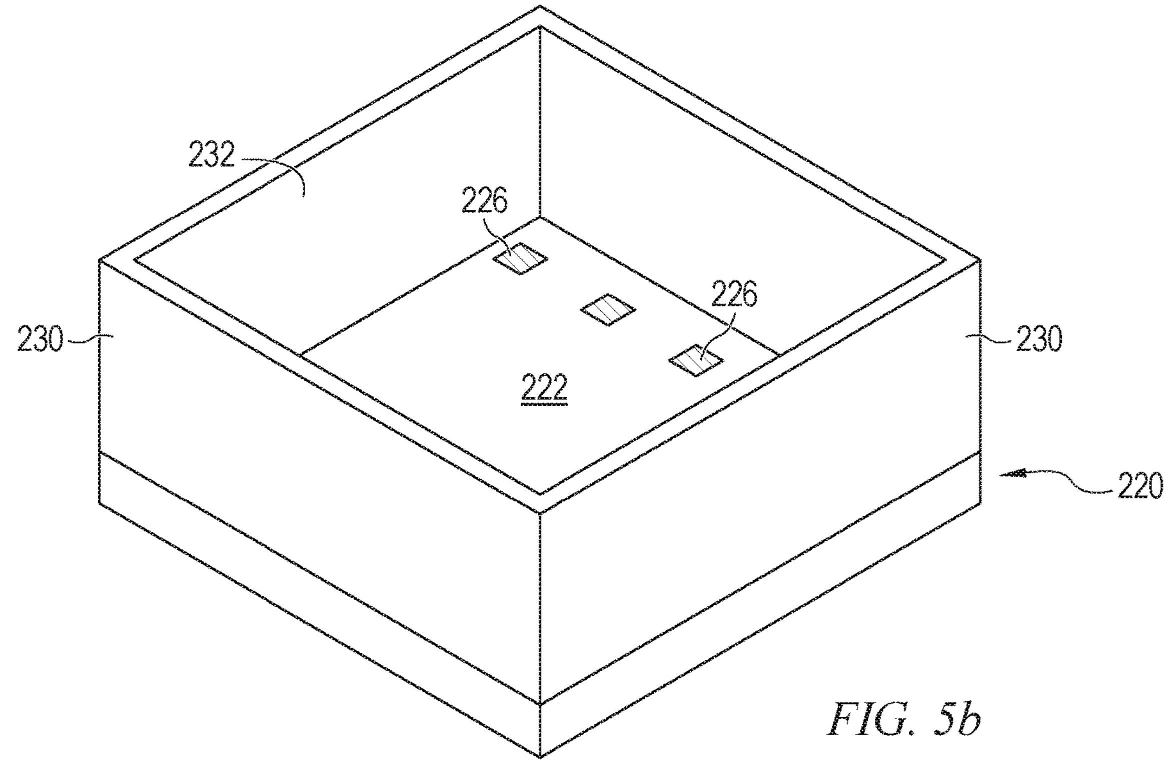

In another embodiment, FIG. 5*a* shows a cross-sectional view of substrate or base 220 made with a multi-layer ceramic, polymer, metal, or other rigid material. For example, the ceramic substrate 220 is formed by multiple ceramic tape layers which are processed with metallization to create the package substrate or package body. Substrate 220 has major surface 222 and major surface 224, opposite surface 222. An electrically conductive layer 226 is formed over surface 222 of substrate 220, and conductive layer 228 is formed over surface 224, similar to conductive layers 126 and 128 in FIG. 3*a*. In particular, substrate 220 includes walls 230 extending from surface 222 of the base. Walls 230 can be integrated as a unitary body with substrate 220, or bonded to surface 222 with an adhesive. In any case, walls 230 define a cavity 232 of substrate 220. FIG. 5*b* is a perspective view of substrate 220 with conductive layers 226 and 228 and walls 230 defining cavity 232.

Figure 5C:
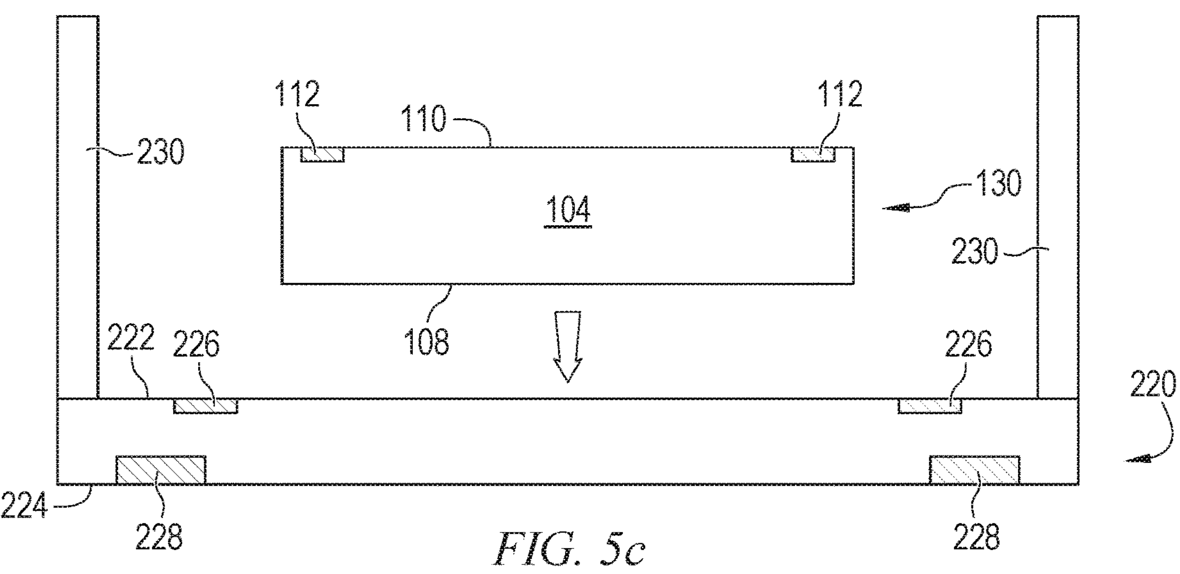
Figure 5D:
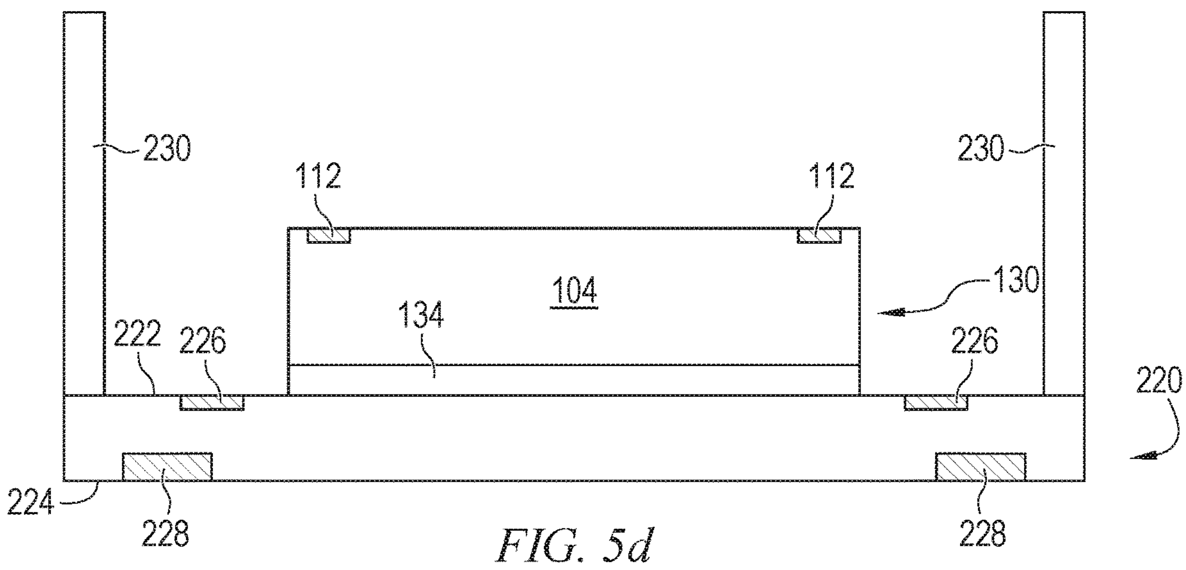

In FIG. 5*c*, electrical component 130 is disposed over surface 222 within cavity 232 of substrate 220, similar to FIG. 3*c*. Elements having similar features are assigned the same reference number. FIG. 5*d* illustrates electrical component 130 bonded to surface 222 of substrate 220 with adhesive 134, similar to FIG. 3*d*.

Figure 5E:
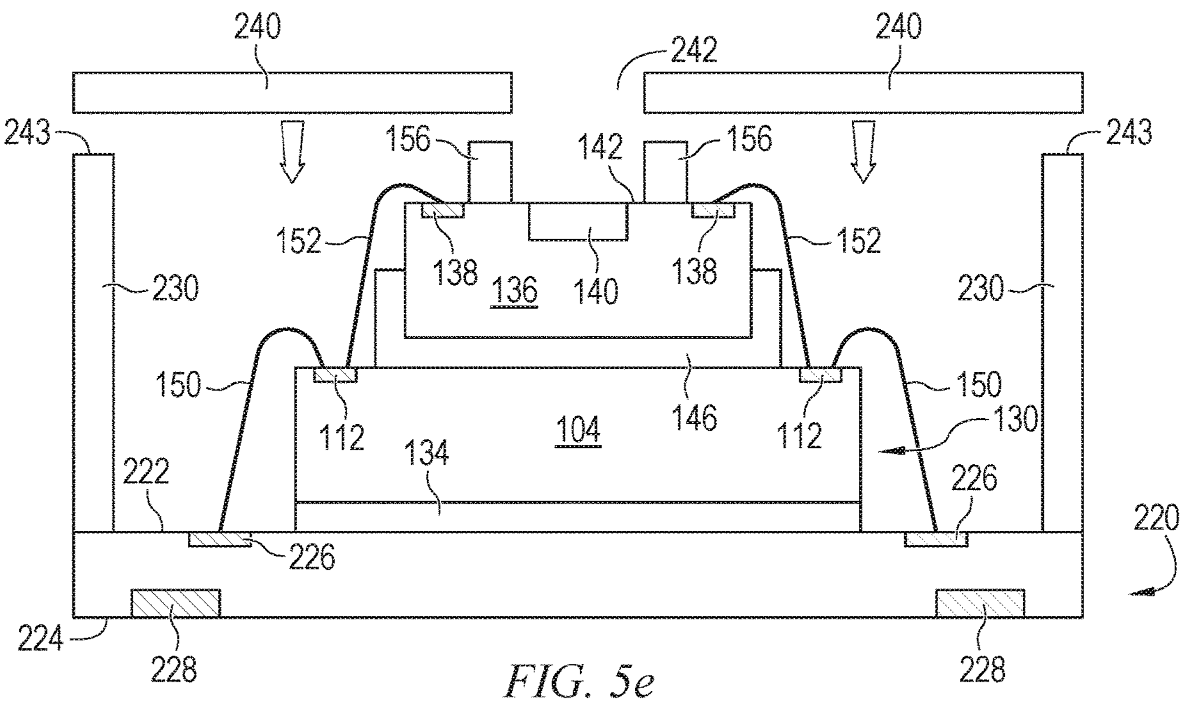

FIG. 5*e* shows electrical component 136 mounted to electrical component 130, similar to FIGS. 3*e*-3*f*. Bond wires 150 and 152 are connected between electrical components 130 and 136 and conductive layer 226, similar to FIG. 3*g*. Adhesive or sealant layer 156 is deposited on surface 142 of electrical component 136 around a perimeter of sensing region 140, similar to FIGS. 3*h*-3*i*.

Figure 5F:
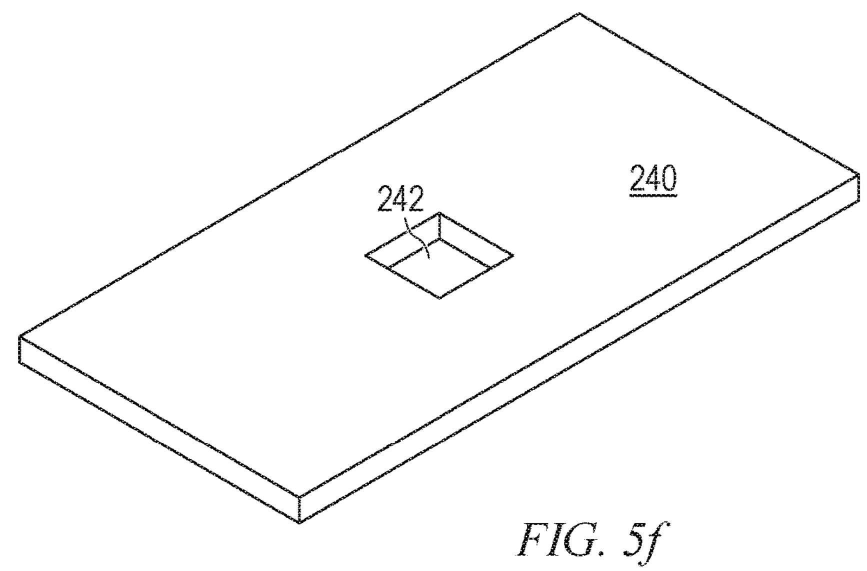
Figure 5G:
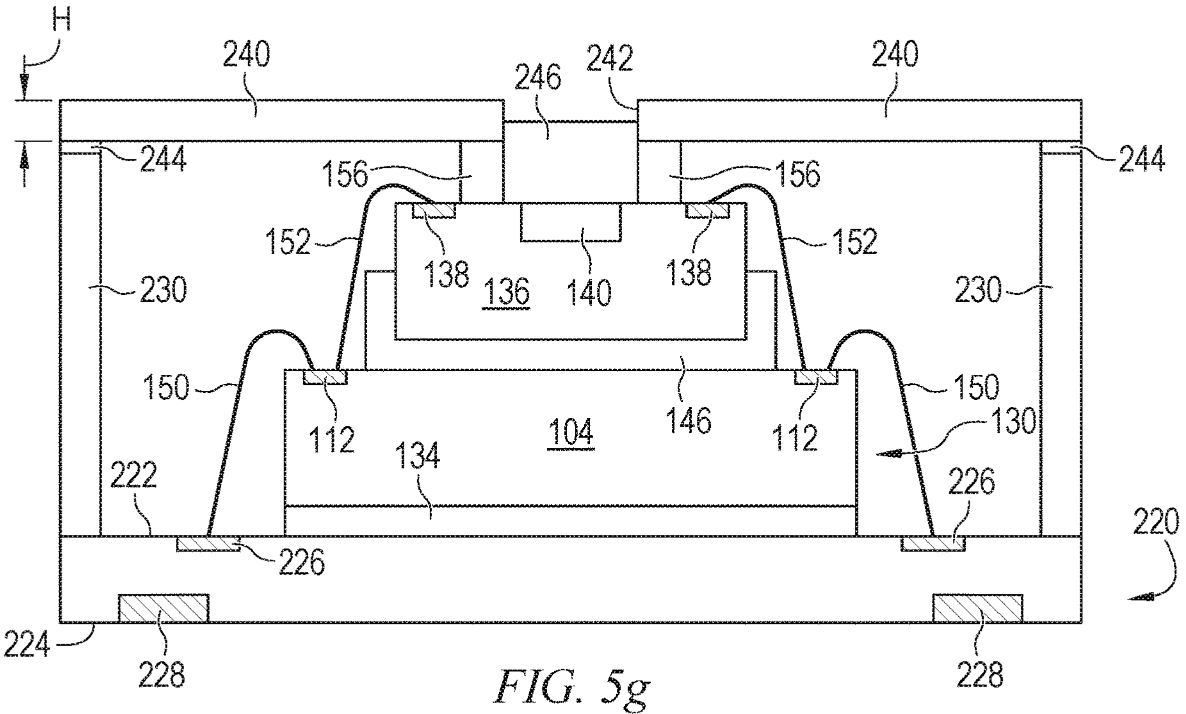

Cover lid 240 is disposed over walls 230 of substrate 220 and electrical components 130 and 136 with opening or window 242 centered or aligned over sensing region 140. In one embodiment, cover lid 240 is a flat plate made with a multi-layer ceramic, polymer, metal, or other rigid material. FIG. 5*f* is a perspective view of cover lid 240 with opening 242. Cover lid 240 is brought into contact with adhesive layer 156 and top surface 243 of walls 230. FIG. 5*g* shows cover lid 240 bonded to surface 243 of walls 230 with adhesive 244 and further bonded to electrical component 136 with adhesive layer 156, with opening 242 exposing sensing region 140. Cover lid 240 seals off electrical components 130 and 136 by nature of adhesive layers 156 and 244, with opening 242 exposing sensing region 140.

Figure 5H:
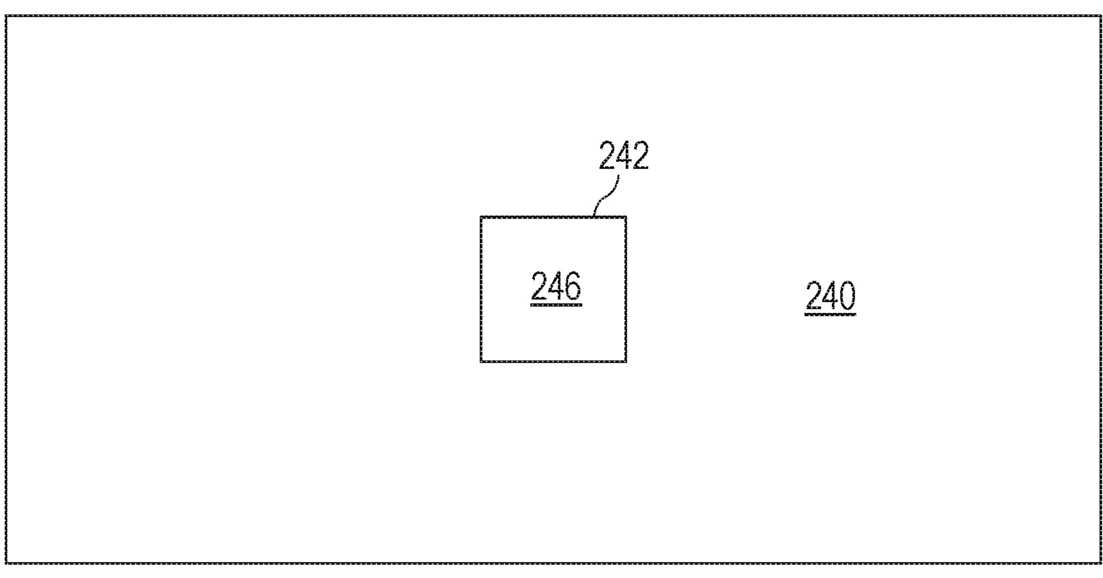

Gel material 246 is deposited within opening 242 over sensing region 140. Gel material 246 can be a malleable material, such as silicone, to transfer external stimuli, such as pressure, through the gel material to sensing region 140. In one embodiment, gel material 246 comes to at least the bottom surface of cover lid 240 and preferably about halfway up, or less than half, a height H of the cover lid. Gel material 246 may extend to a top surface of cover lid 240, or below a bottom surface of cover lid 240. FIG. 5*h* is a top view of cover lid 240 and opening 242 filled with gel material 246.

Figure 5I:
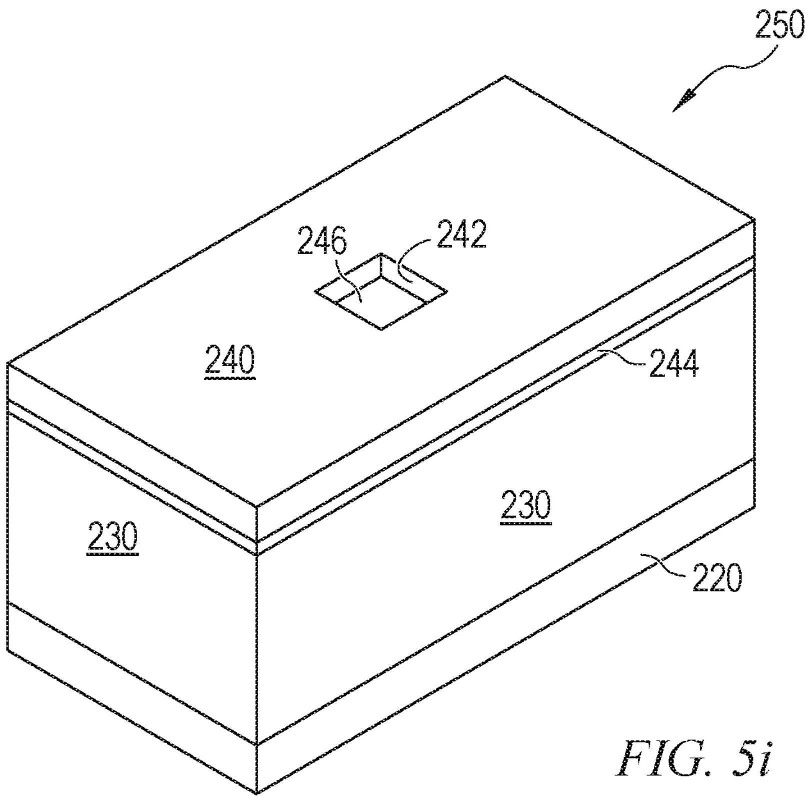

FIG. 5*i* is a perspective view of semiconductor package 250 with cover lid 240 disposed over walls 230 of substrate 220 and electrical components 130 and 136. Gel material 246 is deposited within opening 242 to environmentally seal sensing region 140 and other areas inside cover lid 240, e.g., electrical components 130 and 136 and bond wires 150 and 152. In one embodiment, cover lid 240 with gel material 246 provides a waterproof seal for pressure sensor semiconductor package 250. Semiconductor package 250 with cover lid 240 and opening 242 uses substantially less gel material, as compared to the prior art in FIG. 1, to reduce manufacturing costs and defects.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:

a substrate;

a first electrical component including a sensing region disposed over the substrate;

an adhesive layer disposed on the first electrical component around a perimeter of the sensing region;

a cover lid disposed over the first electrical component and the substrate with an opening in the cover lid aligned over the sensing region, wherein the adhesive layer extends from the first electrical component to the cover lid to bond the first electrical component to the cover lid; and a gel material disposed within the opening of the cover lid and on the sensing region within a boundary defined by the adhesive layer to seal the sensing region with respect to an environmental condition, wherein the gel material physically contacts the adhesive layer and completely fills an area within the boundary defined by the adhesive layer.

2. The semiconductor device of claim 1, wherein the sensing region is responsive to pressure.

3. The semiconductor device of claim 1, wherein the environmental condition is liquid.

4. The semiconductor device of claim 1, wherein the substrate includes:

a base; and a wall extending from the base.

5. The semiconductor device of claim 1, further including a second electrical component disposed between the first electrical component and substrate, wherein the second electrical component is electrically coupled to the first electrical component.

6. A semiconductor device, comprising:

a first electrical component including a sensing region;

an adhesive layer disposed on the first electrical component around a perimeter of the sensing region;

a cover lid disposed over the first electrical component with an opening in the cover lid aligned over the sensing region, wherein the adhesive layer extends from the first electrical component to the cover lid; and a gel material disposed within the opening of the cover lid and on the sensing region within a boundary defined by the adhesive layer to environmentally seal the sensing region.

7. The semiconductor device of claim 6, wherein the sensing region is responsive to an external stimuli.

8. The semiconductor device of claim 6, wherein the sensing region is responsive to pressure.

9. The semiconductor device of claim 6, further including a substrate, wherein the first electrical component is disposed over the substrate and the cover lid extends to the substrate.

10. The semiconductor device of claim 6, further including a substrate comprising:

a base; and a wall extending from the base.

11. The semiconductor device of claim 6, wherein the cover lid is bonded to the first electrical component by the adhesive layer.

12. The semiconductor device of claim 6, further including a second electrical component electrically coupled to the first electrical component.

13. A method of making a semiconductor device, comprising:

providing a first electrical component including a sensing region;

disposing an adhesive layer on the first electrical component around a perimeter of the sensing region;

disposing a cover lid over the first electrical component with an opening in the cover lid aligned over the sensing region, wherein the adhesive layer extends from the first electrical component to the cover lid; and disposing a gel material within the opening of the cover lid and on the sensing region within a boundary defined by the adhesive layer to environmentally seal the sensing region.

14. The method of claim 13, wherein the sensing region is responsive to an external stimuli.

15. The method of claim 13, wherein the sensing region is responsive to pressure.

16. The method of claim 13, further including providing a substrate, wherein the first electrical component is disposed over the substrate and the cover lid extends to the substrate.

17. The method of claim 13, further including providing a substrate comprising:

providing a base; and providing a wall extending from the base.

18. The method of claim 13, further including providing a second electrical component electrically coupled to the first electrical component.

* * * * *